United States Patent
Singh et al.

(10) Patent No.: US 6,482,558 B1
(45) Date of Patent: Nov. 19, 2002

(54) CONDUCTING ELECTRON BEAM RESIST THIN FILM LAYER FOR PATTERNING OF MASK PLATES

(75) Inventors: Bhanwar Singh, Morgan Hill, CA (US); Ramkumar Subramanian, San Jose, CA (US); Bharath Rangarajan, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 66 days.

(21) Appl. No.: 09/782,382

(22) Filed: Feb. 12, 2001

Related U.S. Application Data

(60) Provisional application No. 60/242,762, filed on Oct. 24, 2000.

(51) Int. Cl.$^7$ .............................. G03F 9/00; G03C 5/00
(52) U.S. Cl. ............................ 430/30; 430/5; 430/296; 430/942
(58) Field of Search ............................ 430/5, 30, 296, 430/942

(56) References Cited

U.S. PATENT DOCUMENTS

| | | | |
|---|---|---|---|
| 4,165,395 A | 8/1979 | Chang | 427/43 |
| 4,341,850 A | 7/1982 | Coane | 430/11 |
| 4,612,275 A | 9/1986 | Gregor | 430/296 |
| 4,745,044 A | 5/1988 | Gregor | 430/312 |
| 5,137,799 A | 8/1992 | Kaempf et al. | 430/270 |
| 5,403,680 A | 4/1995 | Otagawa et al. | 429/213 |
| 5,702,566 A | 12/1997 | Tsui | 156/643.1 |
| 5,958,301 A | 9/1999 | Angelopoulos et al. | 252/500 |
| 5,985,516 A | 11/1999 | Shy | 430/296 |
| 6,010,645 A | 1/2000 | Angelopoulos et al. | 252/500 |
| 6,146,794 A | * 11/2000 | Yamazaki | 430/296 |

* cited by examiner

Primary Examiner—Christopher G. Young
(74) Attorney, Agent, or Firm—Amin & Turocy, LLP

(57) ABSTRACT

One aspect of the present invention relates to a system for dissipating electrostatic charge on a mask plate structure containing the mask plate structure containing a substrate, a chromium layer over the substrate, and a conductive polymer over the chromium layer; a conductive structure coupled to the mask plate structure which allows accumulated electrostatic charge to flow from the mask plate structure; a conductive path between the conductive structure and a ground, wherein the conductive path inacludes a switch controlled by a controller; and a detector coupled to the controller for signaling the controller when the accumulation of electrostatic charge is detected. Another aspect of the present invention relates to a method for dissipating charge accumulation during patterning of mask plates using a conductive polymer layer involving the steps of providing a mask substrate having a chromium layer; depositing a conductive polymer layer over the chromium layer; connecting a conductive structure to the mask substrate; irradiating portions of the mask substrate with an electron beam; detecting whether electrostatic charge exists on the mask substrate; and if electrostatic charge is detected, closing a circuit whereby the conductive structure is grounded to permit a flow of electrostatic charge from the mask substrate to the ground.

20 Claims, 3 Drawing Sheets

CONDUCTING ELECTRON BEAM RESIST THIN FILM LAYER FOR PATTERNING OF MASK PLATES

This application claims benefit of Provisional Application No. 60/242,762, filed Oct. 24, 2000.

TECHNICAL FIELD

The present invention generally relates to processing a mask substrate. In particular, the present invention relates to dissipating electrostatic charges which accumulate during patterning of mask plates.

BACKGROUND ART

In the semiconductor industry, there is a continuing trend toward higher device densities. To achieve these high densities there has been and continues to be efforts toward scaling down the device dimensions on semiconductor wafers. In order to accomplish such high device packing density, smaller and smaller features sizes are required. This includes the width and spacing of interconnecting lines and the surface geometry such as corners and edges of various features. Since numerous interconnecting lines are typically present on a semiconductor wafer, the trend toward higher device densities is a notable concern.

The requirement of small features (and close spacing between adjacent features) requires high resolution photolithographic processes. In general, lithography refers to processes for pattern transfer between various media. It is a technique used for integrated circuit fabrication in which a silicon slice, the wafer, is coated uniformly with a radiation-sensitive film, the resist, and an exposing source (such as optical light, X-rays, or an electron beam) illuminates selected areas of the surface through an intervening master template, the photomask, for a particular pattern. The lithographic coating is generally a radiation-sensitized coating suitable for receiving a projected image of the subject pattern. Once the image is projected, it is indelibly formed in the coating. The projected image may be either a negative or a positive of the subject pattern. Exposure of the coating through the photomask causes a chemical transformation in the exposed areas of the coating thereby making the image area either more or less soluble (depending on the coating) in a particular solvent developer. The more soluble areas are removed in the developing process to leave the pattern image in the coating as less soluble polymer.

Since the pattern image is generated by the photomask, providing a high quality photomask is critical to the formation of integrated circuits. Photomasks are often made of a patterned chromium layer over a quartz substrate. The patterned chromium layer is typically made using an electron beam resist. In particular, an electron beam resist is deposited and patterned over the chromium layer. The exposed portions of the chromium layer (not covered by the patterned electron beam resist) are etched and removed from the quartz substrate.

There are a number of problems associated with making photomasks. Patterning the electron beam resist of the mask plate structure involves irradiating the resist with an electron beam. The resist material is typically a hardened polymer material that is highly insulating. Electron beam irradiation undesirably produces electrostatic charge on the surface of the mask plate structure. Specifically, when an electron beam is directed at the insulating surface of the resist, electrostatic charge tends to accumulate on the surface of the resist, creating an electric field which may subsequently distort the electron beam adjacent the surface. This may lead to poor pattern resolution.

Another problem with making photomasks is inspecting the mask substrates with an electron beam emitting device. Using an electron beam, such as from a scanning electron microscope (SEM), to evaluate a patterned resist on a mask substrate tends to undesirably induce the formation of electrostatic charges on the surface of the resist. In light of these problems, there is an unmet need for preventing and/or dissipating electrostatic charge on photomasks during fabrication.

SUMMARY OF THE INVENTION

The present invention provides a system and a method for dissipating electrostatic charge which may accumulate on a patterned electron beam resist clad mask plate. More specifically, the present invention provides a system and method for removing the electrostatic charge formed, in part, during electron beam exposure and/or during inspection of a patterned electron beam resist clad mask plate.

One aspect of the present invention relates to a system for dissipating electrostatic charge, which has accumulated during patterning of mask plates, containing a mask substrate, a chromium layer deposited over the substrate, and a conductive electron beam photoresist deposited over the chromium layer; a conductive structure coupled to the mask plate structure which allows accumulated electrostatic charge to flow from the mask plate structure; a conductive path between the conductive structure and a ground, wherein the conductive path includes a switch controlled by a controller; and a detector coupled to the controller for signaling the controller when an accumulation of electrostatic charge is detected.

Another aspect of the present invention relates to a method for dissipating electrostatic charge, which has accumulated on a conductive electron beam resist during patterning of a mask plate, involving the steps of providing a mask substrate having a chromium layer; depositing a conductive electron beam resist over the chromium layer; connecting a conductive structure to the mask substrate; irradiating portions of the mask substrate with an electron beam; detecting whether electrostatic charge exists on the mask substrate; and if electrostatic charge is detected, closing a circuit whereby the conductive structure is grounded to permit a flow of electrostatic charge from the mask substrate to a ground.

Yet another aspect of the present invention relates to using a conductive polymer layer in a system for dissipating electrostatic charge existing on a mask plate. The system contains a mask plate structure comprising a mask substrate, a chromium layer deposited over the substrate, an electron beam resist deposited over the chromium layer, and a conductive polymer deposited over the electron beam resist for dissipating an accumulation of electrostatic charge; a conductive structure coupled to the mask plate structure; a conductive path running between the conductive structure and a ground, wherein the conductive path includes a switch controlled by a controller; and a detector coupled to the controller for signaling the controller when an accumulation of electrostatic charge is detected.

Still yet another aspect of the present invention relates to a method for dissipating electrostatic charge existing on a mask plate structure by employing a conductive polymer layer. The method involves the steps of providing a mask substrate having a chromium layer; depositing an electron beam resist over the chromium layer; depositing a conductive polymer layer over the electron beam resist; connecting a conductive structure to the mask substrate; irradiating portions of the mask substrate with an electron beam; detecting whether electrostatic charge exists on the mask substrate; and if electrostatic charge is detected, closing a circuit whereby the conductive structure is grounded to permit a flow of electrostatic charge from the mask substrate to a ground.

DISCLOSURE OF INVENTION

Figure 1:
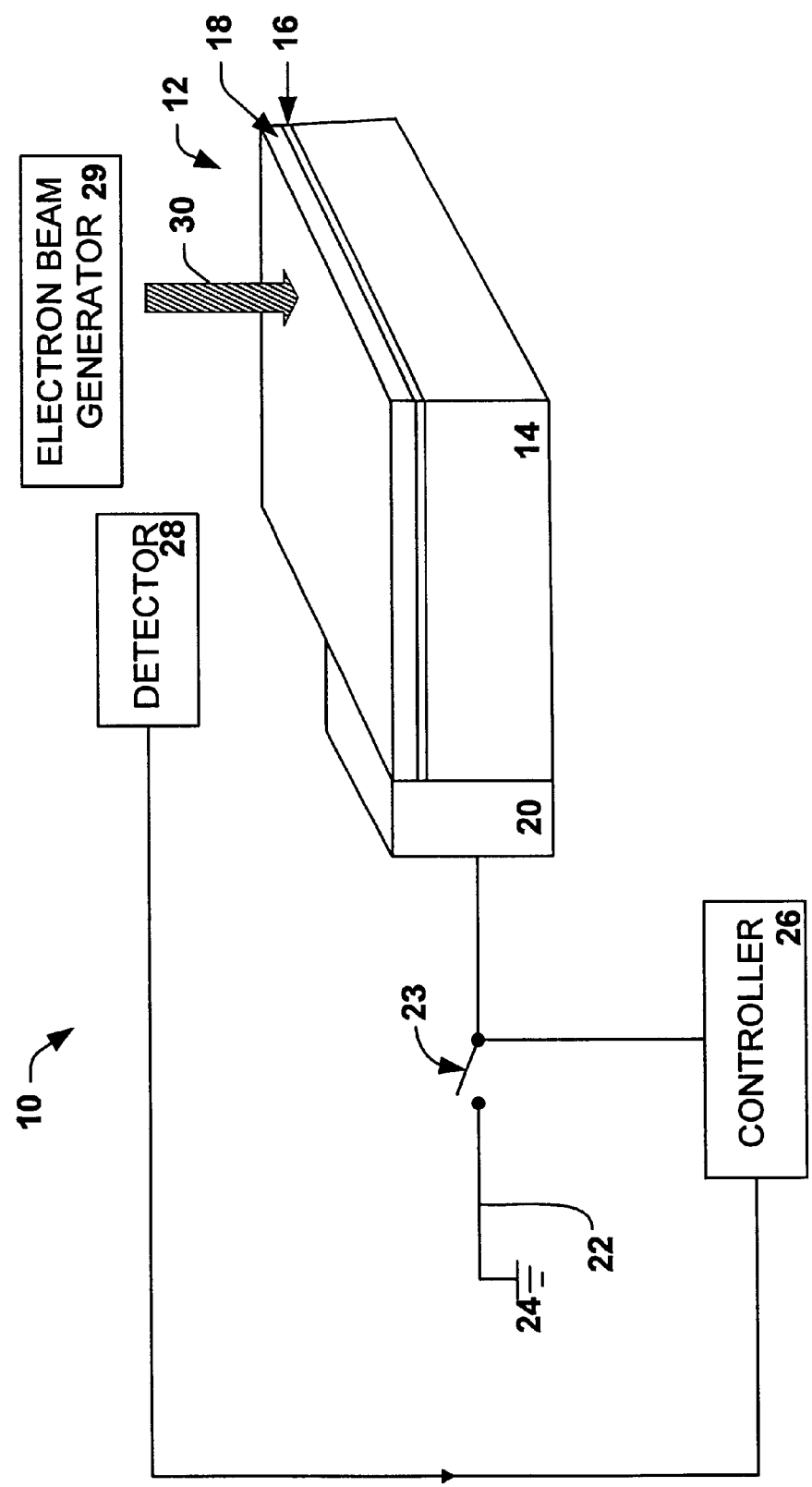
FIG. 1 illustrates a high-level schematic diagram of a system for dissipating electrostatic charge in accordance with one aspect of the present invention.

The present invention involves a method and a system for dissipating electrostatic charge which accumulates during processing of electron beam resist clad mask plates using electron beam radiation. One aspect of the present invention more specifically relates to a system and a method using a conductive electron beam photoresist to pattern a mask plate, and electrically grounding the mask plate structure to a conductive structure in such a way that if electrostatic charge is detected on the mask plate structure, a flow of electrostatic charge is permitted to drain from the mask plate structure. As a result of the present invention, the use and inspection of electron beam resist clad mask plate structures is facilitated. Since the processing of electron beam resists is improved, higher quality photomasks are obtainable which leads to improved lithography processing.

Photomasks comprise a patterned chromium layer over a quartz substrate. The chromium layer is typically patterned using an electron beam resist. In particular, an electron beam resist is deposited and patterned over the chromium layer covering desired portions of the chromium layer. The exposed portions of the chromium layer (not covered by the patterned electron beam resist) are etched and removed from the quartz substrate.

In the present invention, the chromium layer is patterned using a conductive polymer layer. Either the electron beam resist is conductive or a thin conductive polymer layer is formed over the electron beam resist. The conductive nature of the electron beam resist or thin polymer layer allows the resist or polymer layer to dissipate electrostatic charge. When coupled to a conductive structure and electrically grounded, the conductive electron beam resist or conductive polymer layer mitigates electrostatic charge accumulation on a mask plate structure. Instead of the electrostatic charge accumulating, the charges flow from the mask plate structure to a ground such that formation of an electric field on the mask plate is minimized and/or eliminated. Consequently, photomasks made in accordance with the present invention lead to less distortion in subsequent lithography processing.

The conductive polymer comprises a polymer that is electrically conductive. Conductive polymers exhibit the electronic and magnetic properties characteristic of metals while retaining the physical and mechanical properties associated with conventional organic polymers. Examples of conductive polymers include polyparaphenylene vinylenes, polyparaphenylenes, polyanilines, polythiophenes, polyazines, polyfuranes, polythianaphthenes polypyrroles, polyselenophenes, poly-p-phenylene sulfides, polyacetylenes, combinations thereof and blends thereof with other polymers and copolymers of the monomers thereof. These conductive polymers maybe employed in an electron beam resist or in a thin conductive layer formed over the electron beam resist.

The conductive nature associated with conductive polymers facilitates charge dissipation of a mask plate structure by allowing accumulated electrostatic charge to flow from the mask plate structure to a ground. In this invention, a conductive structure is provided connecting the mask plate structure to a ground. The conductive structure may include metal contacts in or on the mask plate structure connected to a circuit leading to the ground.

Referring to FIG. 1, a system 10 for dissipating electrostatic charge which may accumulate during patterning and inspection of an electron beam resist clad mask plate is shown. A mask plate structure 12 comprises a substrate 14, a chromium layer 16, and a conductive electron beam resist 18. The substrate 14 may be quartz, glass, or any other suitable transparent substrate. The chromium layer 16 may be of any thickness depending on the type of photomask. On the substrate 14, the chromium layer 16 is deposited using suitable deposition techniques such as sputtering and vapor deposition. The conductive electron beam resist 18 is deposited over the chromium layer using suitable deposition techniques such as spin-coating. The conductive electron beam resist 18 contains a conductive polymer, either as the primary polymeric material or in addition to the polymeric material conventionally found in electron beam resists.

The mask plate structure 12 is either coupled to a conductive structure 20 or has a conductive structure 20 incorporated therein. Examples of the conductive structure 20 include a clamp, a plug, a pin, a wire, a series of pins, plugs, and/or wires, or any other suitable conductive structures. The conductive structure 20 facilitates a flow of electrostatic charge (current) from the mask plate structure 12 along a conductive path 22 to a ground 24. The conductive path includes a switch 23 which is controlled by a controller 26.

The conductive structure 20, the conductive path 22, the switch 23 and the ground 24 effectively form a circuit. The circuit including its switch 23 may be controlled by the controller 26. The controller 26 is connected to a detector 28. The detector 28 is directed over or above an electron beam resist clad mask plate structure 12 and detects the presence of electrostatic charge and/or the magnitude of the electrostatic charge. Prior to electrostatic charge detection, the electron beam resist 18 is selectively irradiated by an electron beam 30 of an electron beam generator 29 and then developed. If electrostatic charge is detected (or a specified threshold value is exceeded) on the electron beam resist clad mask plate structure, the controller is signaled to close the switch 23, thereby completing the circuit to allow the flow of electrostatic charge from the mask plate structure to the ground 24. This flow of electrostatic charge from the mask plate structure to the ground 24 effectively mitigates the accumulation electrostatic charge, thereby alleviating difficulty in achieving line-width and critical dimension control for smaller feature formation associated with electron beam resists.

If electrostatic charge is not detected (or a specified threshold value is not exceeded) on the electron beam resist clad mask plate structure, the controller is signaled to keep the switch 23 open, or no signal is sent to close the switch 23. The mask plate structure then proceeds to further processing.

Figure 2:
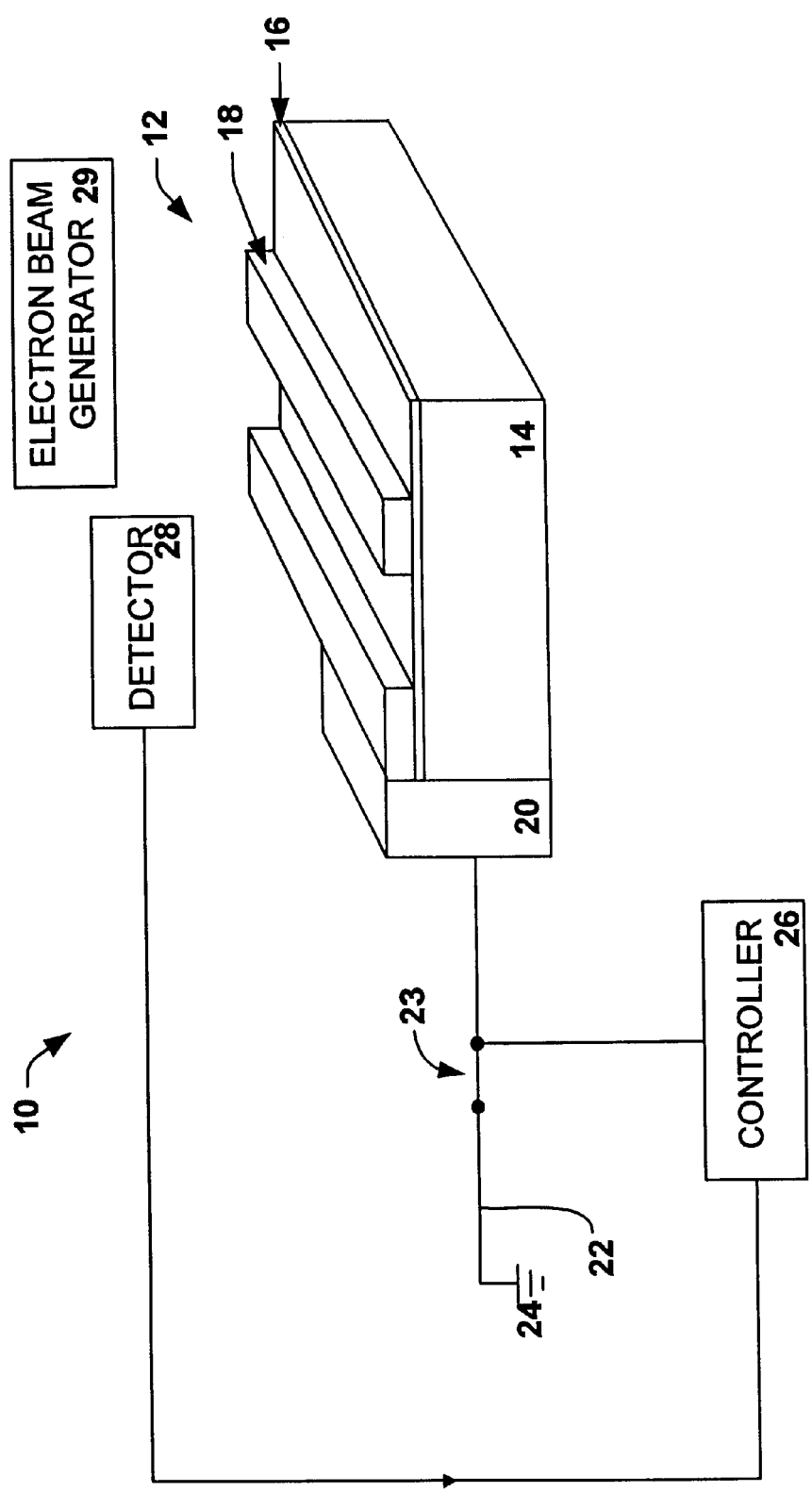
FIG. 2 illustrates a high-level schematic diagram of a system for dissipating electrostatic charge in accordance with another aspect of the present invention.

FIG. 2 illustrates the mask plate structure 12 following selective irradiation and development of the electron beam resist 18, wherein the electron beam resist is patterned. After the electron beam resist 18 is exposed to the electron beam 30, the detector 28 detects a presence of electrostatic charge on the mask plate structure 12. In response, the controller 26 closes the switch 23 thereby dissipating the electrostatic charge.

Figure 3:
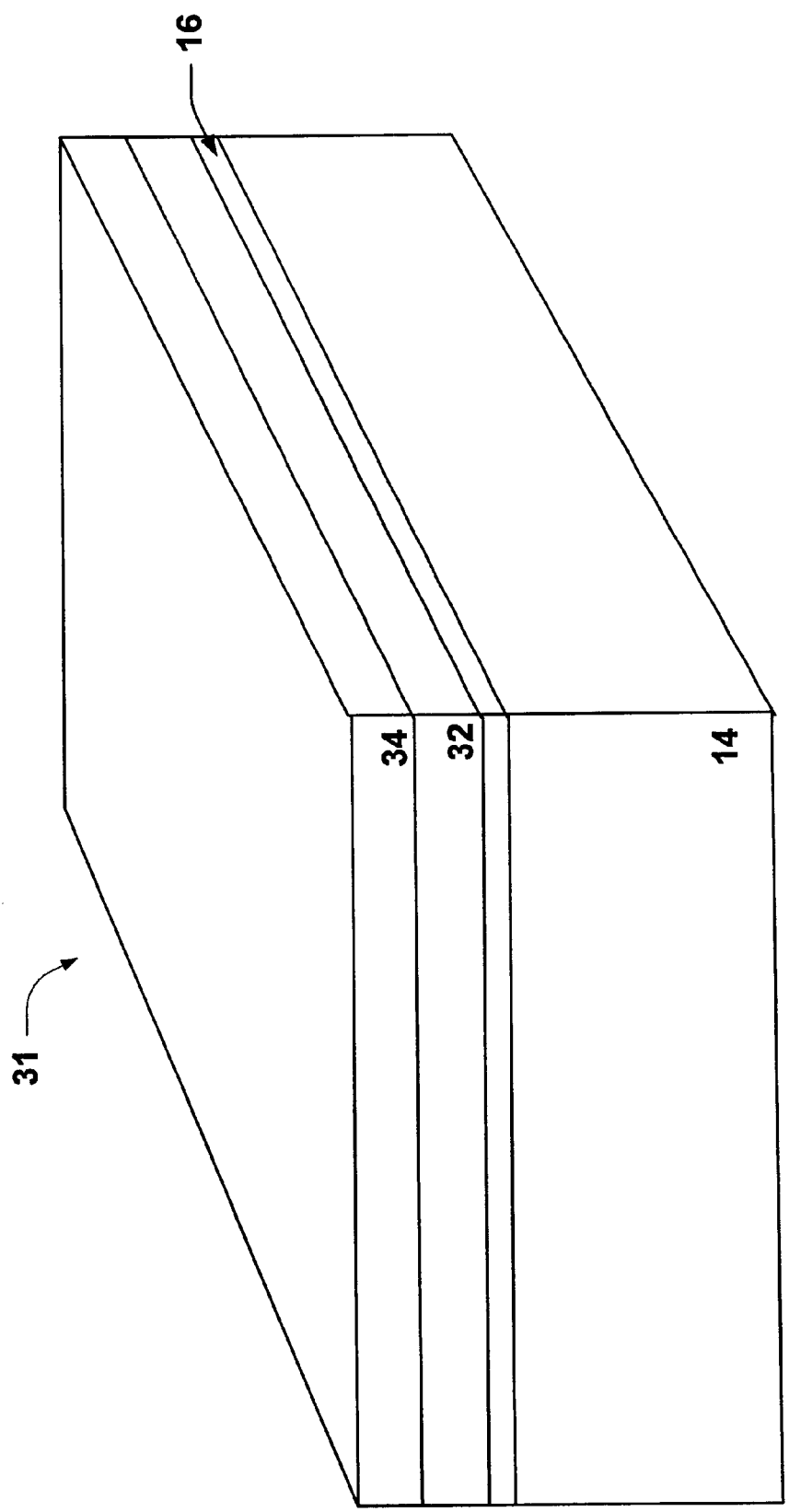
FIG. 3 illustrates a cross-sectional diagram of a mask plate structure in accordance with another aspect of the present invention.

Referring to FIG. 3, another aspect of the present invention is shown. A mask plate structure 31 maybe used in the system 10 of FIG. 1 in place of mask plate structure 12. Mask plate structure 31 includes a substrate 14 having a chromium layer 16 thereover, an electron beam resist 32 over the chromium layer 16, and a thin conductive polymer layer 34 over the electron beam resist 32. As mentioned in connection with FIG. 1, substrate 14 may comprise quartz, a glass, or any other suitable trasparent substrate to carry out the present invention. An electron beam resist 32 is deposited over the chromium layer 16 using suitable deposition techniques such as spin-coating. The thickness of the electron beam resist 32 may vary according to the desired type of photomask. A conductive polymer 34 is formed over the electron beam resist 32.

Deposition of the thin conductive polymer 34 is accomplished using suitable deposition techniques such as spin-coating. The thin conductive polymer 34 has a thickness of about 2,500 Å or less. In another embodiment, the conductive polymer 34 has a thickness of about 2,000 Å or less. In yet another embodiment, the conductive polymer 34 has a thickness of about 1,500 Å or less. The combination of the electron beam resist 32 and conductive polymer 34 of FIG. 3 essentially function in same manner as the conductive electron beam resist 18 of FIG. 1.

During photomask fabrication, portions of the mask plate structure 12 and in particular, portions of the conductive electron beam resist 18, are irradiated by an electron beam. This may result in the accumulation of electrostatic charge on the surface of the mask plate structure. Accumulation of electrostatic charge may also result from inspection of the mask plate structure 12 by a SEM. The conductive nature of a mask plate's top layer (i.e., conductive polymer or conductive electron beam resist) facilitates charge dissipation by allowing these charges to flow from the structure to a ground, thereby mitigating processing defects associated with undesired electrostatic charge.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A system for dissipating electrostatic charge on a mask plate structure comprising:
the mask plate structure comprising:
a substrate,
a chromium layer over the substrate, and
a conductive electron beam resist over the chromium layer;
a conductive structure coupled to the mask plate structure which allows accumulated electrostatic charge to flow from the mask plate structure;
a conductive path between the conductive structure and a ground, wherein the conductive path includes a switch controlled by a controller; and
a detector coupled to the controller for signaling the controller when the accumulation of electrostatic charge is detected.

2. The system of claim 1, wherein the conductive structure coupled to the mask plate structure comprises a pin or a wire.

3. The system of claim 1, wherein the switch located within a conductive path is closed by the controller when the detector detects electrostatic charge on the mask plate structure.

4. The system of claim 3, wherein the closed switch permits the accumulated electrostatic charge to flow from the conductive structure to the ground via the conductive path.

5. The system of claim 1, wherein the conductive electron beam resist comprises at least one of a polyparaphenylene vinylene, a polyparaphenylene, a polyaniline, a polythiophene, a polyazine, a polyfurane, a polythianaphthene, a polypyrrols, a polyselenophene, a poly-p-phenylene sulfide, a polyacetylene, and copolymers thereof.

6. A method for dissipating charge accumulation during patterning of mask plates using a conductive electron beam resist comprising:
providing a mask substrate having a chromium layer;
depositing a conductive electron beam resist over the chromium layer;
connecting a conductive structure to the mask substrate;
irradiating portions of the mask substrate with an electron beam;
detecting whether electrostatic charge exists on the mask substrate; and
if electrostatic charge is detected, closing a circuit whereby the conductive structure is grounded to permit a flow of electrostatic charge from the mask substrate to the ground.

7. The method of claim 6, wherein detecting electrostatic charge comprises detecting a presence and a magnitude of electrostatic charge on the mask substrate.

8. The method of claim 6, wherein closing a circuit comprises using a controller whereby the controller closes a switch associated with the circuit, allowing a current of electrostatic charge to be grounded.

9. The method of claim 6, wherein the conductive electron beam resist comprises at least one of a polyparaphenylene vinylene, a polyparaphenylene, a polyaniline, a polythiophene, a polyazine, a polyfurane, a polythianaphthene, a polypyrrols, a polyselenophene, a poly-p-phenylene sulfide, a polyacetylene, and copolymers thereof.

10. A system for dissipating electrostatic charge on a mask plate structure comprising:
the mask plate structure comprising:
a substrate,
a chromium layer over the substrate, an electron beam resist over the chromium layer, and a conductive polymer over the electron beam resist;

a conductive structure coupled to the mask plate structure;

a conductive path running between the conductive structure and a ground, wherein the conductive path comprises a switch controlled by a controller; and a detector coupled to the controller for signaling the controller when the accumulation of electrostatic charge is detected.

11. The system of claim 10, wherein the conductive polymer comprises at least one of a polyparaphenylene vinylene, a polyparaphenylene, a polyaniline, a polythiophene, a polyazine, a polyfurane, a polythianaphthene, a polypyrrols, a polyselenophene, a poly-p-phenylene sulfide, a polyacetylene, and copolymers thereof.

12. The system of claim 10, wherein the conductive polymer has a thickness of about 2,500 Å or less.

13. The system of claim 10, wherein the conductive structure comprises a pin, a clamp, a plug, a wire, a series of pins, a series of plugs, or a series of wires.

14. The system of claim 10, wherein the switch is closed by the controller when the detector detects electrostatic charge on the mask plate structure.

15. The system of claim 14, wherein the closed switch completes a circuit, permitting the accumulated electrostatic charge to flow from the conductive structure to the ground via the conductive path so as to reduce the accumulation of electrostatic charge on the mask plate structure.

16. A method for dissipating charge accumulation during patterning of mask plates comprising:

providing a mask substrate having a chromium layer;

depositing an electron beam resist over the chromium layer;

depositing a conductive polymer over the electron beam resist;

connecting a conductive structure to the mask substrate;

irradiating portions of the mask substrate with an electron beam;

detecting whether electrostatic charge exists on the mask substrate; and if electrostatic charge is detected, closing a circuit whereby the conductive structure is grounded to permit a flow of electrostatic charge from the mask substrate to the ground.

17. The method of claim 16, wherein the conductive polymer has a thickness of about 2,500 Å or less.

18. The method of claim 16, wherein detecting electrostatic charge comprises detecting a presence and a magnitude of electrostatic charge on the mask substrate.

19. The method of claim 16, wherein closing a circuit further comprises using a controller whereby the controller closes a switch associated with the circuit, allowing a current of electrostatic charge to be grounded.

20. The method of claim 16, wherein the conductive polymer comprises at least one of a polyparaphenylene vinylene, a polyparaphenylene, a polyaniline, a polythiophene, a polyazine, a polyfurane, a polythianaphthene, a polypyrrols, a polyselenophene, a poly-p-phenylene sulfide, a polyacetylene, and copolymers thereof.

* * * * *